(12) United States Patent
Hashimoto

(10) Patent No.: US 9,230,872 B2
(45) Date of Patent: Jan. 5, 2016

(54) LEAD-FREE GLASS FOR SEMICONDUCTOR ENCAPSULATION

(75) Inventor: Koichi Hashimoto, Shiga (JP)

(73) Assignee: NIPPON ELECTRIC GLASS CO., LTD., Otsu-shi, Shiga (JP)

( * ) Notice: Subject to any disclaimer, the term of this patent is extended or adjusted under 35 U.S.C. 154(b) by 0 days.

(21) Appl. No.: 13/805,039

(22) PCT Filed: Jun. 17, 2011

(86) PCT No.: PCT/JP2011/063917
§ 371 (c)(1),
(2), (4) Date: Dec. 18, 2012

(87) PCT Pub. No.: WO2012/002174
PCT Pub. Date: Jan. 5, 2012

(65) Prior Publication Data
US 2013/0090227 A1 Apr. 11, 2013

(30) Foreign Application Priority Data
Jul. 1, 2010 (JP) .................................. 2010-150971

(51) Int. Cl.
| H01L 23/29 | (2006.01) |
| C03C 8/02 | (2006.01) |
| C03C 3/068 | (2006.01) |
| C03C 3/095 | (2006.01) |
| C03C 8/24 | (2006.01) |
| H01L 33/56 | (2010.01) |

(52) U.S. Cl.
CPC .............. *H01L 23/291* (2013.01); *C03C 3/068* (2013.01); *C03C 3/095* (2013.01); *C03C 8/24* (2013.01); *H01L 33/56* (2013.01); *H01L 2924/0002* (2013.01)

(58) Field of Classification Search
CPC .......... H01L 23/291; C03C 8/24; C03C 8/02; C03C 3/068; C03C 3/095
USPC ............... 501/14, 15, 21, 26, 64, 78
See application file for complete search history.

(56) References Cited

U.S. PATENT DOCUMENTS

| 5,179,047 A * | 1/1993 | Chiba ............................. 501/15 |
| 5,296,415 A * | 3/1994 | Podesta ........................... 501/25 |
| 6,204,212 B1 * | 3/2001 | Kunert et al. .................... 501/67 |
| 6,287,996 B1 * | 9/2001 | Chiba et al. ...................... 501/17 |
| 6,534,346 B2 * | 3/2003 | Kosokabe ...................... 438/127 |
| 7,968,380 B2 * | 6/2011 | Hashimoto ................... 438/127 |
| 2006/0105898 A1 | 5/2006 | Ide |
| 2007/0032364 A1 * | 2/2007 | Onoda et al. ..................... 501/15 |
| 2009/0325349 A1 | 12/2009 | Hashimoto |

FOREIGN PATENT DOCUMENTS

| CN | 1616364 A | 5/2005 |
| EP | 1156020 | 11/2001 |
| JP | 50026815 | * 3/1975 |
| JP | 52-966 | * 1/1977 |
| JP | A-59-174544 | 10/1984 |
| JP | H01-122937 A | 5/1989 |
| JP | A-09-295831 | 11/1997 |
| JP | A-2001-048573 | 2/2001 |
| JP | A-2002-037641 | 2/2002 |
| JP | 2002187734 | * 7/2002 |
| JP | 2004359542 | * 12/2004 |
| JP | 2005041729 | * 2/2005 |
| JP | A-2008-266082 | 11/2008 |
| JP | A-2009-013002 | 1/2009 |
| JP | 2009263168 | * 11/2009 |
| JP | A-2010-006627 | 1/2010 |
| JP | A-2011-116578 | 6/2011 |
| JP | 2011-132113 A | 7/2011 |
| WO | WO-2009/157365 A1 | 12/2009 |

OTHER PUBLICATIONS

U.S. Office Action dated Aug. 15, 2014 that issued in U.S. Appl. No. 13/882,893 including double patenting rejections at pp. 3-5.
U.S. Office Action dated Aug. 19, 2014 that issued in U.S. Appl. No. 13/884,031 including double patenting rejections at pp. 5-7.
Office Action dated Oct. 15, 2014 from corresponding Japanese Patent Application 2011-132900 and English translation thereof.
A Japanese Office Action (with machine English-language translation) dated May 18, 2015 that issued in Japanese patent application No. 2011-132900.

* cited by examiner

*Primary Examiner* — Karl Group
(74) *Attorney, Agent, or Firm* — Drinker Biddle & Reath LLP

(57) ABSTRACT

The technical task of the present invention is to provide a lead-free glass for semiconductor encapsulation, which is easy to automate an appearance inspection, and furthermore, has excellent refinability and encapsulatability of semiconductor devices. In the lead-free glass for semiconductor encapsulation according to the present invention, a temperature at which the viscosity of glass is $10^6$ dPa·s is 670° C. or lower, and, as a glass composition, the content of $CeO_2$ is from 0.01 to 6% by mass, and the content of $Sb_2O_3$ is 0.1% by mass or less.

4 Claims, No Drawings

LEAD-FREE GLASS FOR SEMICONDUCTOR ENCAPSULATION

TECHNICAL FIELD

The present invention relates to a lead-free glass for semiconductor encapsulation, particularly a glass for encapsulating semiconductor devices such as thermistors, diodes and LEDs.

BACKGROUND ART

Semiconductor devices, such as thermistors, diodes and LEDs, require an air-tight encapsulation. In the past, a lead glass has been used for air-tightly encapsulating semiconductor devices, but recently, a lead-free glass has also been known, which is introduced in Patent Document 1 or 2. For a glass used for a semiconductor encapsulation, a glass raw material is melt in a melting furnace to form the molten glass in a tube shape, and then, the obtained glass tube is cut to a length of about 2 mm, and washed to produce a short glass tube which is referred to as a bead. Subsequently, by an inspection, the glass tube with defects or cracks are removed, and then shipped. Further, in an assembly of a diode, there is a case where the glass is exposed to an acidic plating solution or a flux in order for terminal treatment.

For the glass for semiconductor encapsulation, the following characteristics are required: (1) to be able to encapsulate semiconductor devices at a low temperature which does not deteriorate them, (2) to have a thermal expansion coefficient corresponding to the thermal expansion coefficients of metallic wires which input and output signals to and from semiconductor devices as well as the semiconductor devices, in order to ensure a reliable adhesion, (3) to have a sufficiently high adhesion between the glass and metal wires, (4) to have a high volume resistivity, (5) to have a sufficiently high chemical resistance, and the like.

CITATION LIST

Patent Document

Patent Document 1: JP-A 2002-37641
Patent Document 2: U.S. Pat. No. 6,864,197

SUMMARY OF THE INVENTION

Problems to be Solved by the Invention

In the past, when encapsulating a semiconductor device, adhesion between a glass and a metallic wire has been ensured by generating an excess oxide film on the metallic wire such as Dumet wire, and then, diffusing the oxide in the glass. At this time, the encapsulation temperature and the encapsulation time are adjusted so as to generate an oxide film having an appropriate thickness. Particularly, the encapsulation temperature and the encapsulation time are adjusted such that the color tone of the oxide film turns dark red. If the color tone of the oxide film is black, the oxide film is peeled from the metallic wire, and thus, encapsulation cannot be appropriately performed. Further, if the oxide film is disappeared to exhibit metallic luster, the adhesion between the glass and the metallic wire is lost, and thus, encapsulation cannot be appropriately performed as well.

In addition, if tunnel-type bubble is present in the glass tube, the inside and outside of the glass tube are connected, and thus, there is a concern that air-tightness may be failed. Accordingly, the glass for semiconductor devices having a low temperature encapsulation property generally comprises approximately 0.8% by mass of $Sb_2O_3$, which exhibits a refining effect at a low temperature.

However, since $Sb_2O_3$ is apt to be subjected to a reduction action, and also has a function to provide oxygen to the glass, $Sb_2O_3$ itself is reduced to metal, and thus, there is a concern that Sb metal particulates may be generated in the glass. In this case, when the glass comes into contact with the semiconductor device, there is a concern that the reduced Sb metal particulates may adversely affect the characteristics of the semiconductor devices. Further, when the glass tends to be reduced, the diffusion speed of the oxide film of the metallic wire is changed, and thus, there is also a concern that the semiconductor device cannot be stably encapsulated.

In order to prevent these situations, in the past, the melting has been performed at a low temperature for a long time, and an oxidizing agent such as a nitrate salt has been added as well, such that the glass does not tend to be reduced. However, since the oxidizing agent such as a nitrate salt has high environmental loads, and the Sb compound itself also has a concern of environmental loads, it is required to reduce the content thereof.

Further, recently, the glass tube used for encapsulating semiconductor devices requires an automation of an appearance inspection in order to enhance the production efficiency. In the case where the appearance inspection is automated by a CCD camera and the like, the appearance may be observed from the side of the glass tube, and thus, it is preferred that the glass tube is colored, or fluoresces.

Therefore, the present invention intends, as a technical task, to provide a lead-free glass for semiconductor encapsulation, which is easy to automate an appearance inspection, and furthermore, has excellent refinability and encapsulatability of semiconductor devices.

Means for Solving the Problems

The present inventors have studied intensively, and as a result, have found out that the technical problems may be solved by controlling the content of $Sb_2O_3$ to 0.1% by mass or less in a glass which basically does not comprise PbO and introducing $CeO_2$.

Incidentally, Patent Document 2 describes that $CeO_2$ is used as a refining agent, but allows the coexistence with $Sb_2O_3$, and further, fails to explain about effects by using $CeO_2$ instead of $Sb_2O_3$.

That is, the lead-free glass for semiconductor encapsulation of the present invention is characterized to be a lead-free glass for semiconductor encapsulation wherein a temperature at which the viscosity of glass is $10^6$ dPa·s is 670° C. or lower, and, as a glass composition, the content of $CeO_2$ is from 0.01 to 6% by mass, and the content of $Sb_2O_3$ is 0.1% by mass or less.

Meanwhile, in the present invention, the term "lead-free" indicates that a lead material is not actively added as a glass raw material, and it does not indicate the incorporation from impurity or likes is completely excluded. More particularly, the content of PbO in the glass composition is controlled to 1000 ppm or less, including incorporation from impurity or likes.

In the present invention, the lead-free glass for semiconductor encapsulation which consists of $SiO_2$—$B_2O_3$—$R_2O$ (R is an alkali metal) based glass, and comprises two or more of $Li_2O$, $Na_2O$ and $K_2O$ as the $R_2O$ is preferable. In the present invention, "$SiO_2$—$B_2O_3$—$R_2O$-based glass" means a glass comprising $SiO_2$, $B_2O_3$ and $R_2O$ (alkali metal oxide) as essential components.

According to the above-mentioned constitution, it is easy to set the temperature at which the viscosity of glass is $10^6$ dPa·s to 670° C. or lower.

In the present invention, the lead-free glass for semiconductor encapsulation which comprises, as a glass composition, from 20 to 65% of $SiO_2$, from 0 to 10% of $Al_2O_3$, from 10 to 40% of $B_2O_3$, from 0 to 10% of MgO, from 0 to 10% of CaO, from 0 to 10% of SrO, from 0 to 10% of BaO, from 0 to 35% of ZnO, from 0.2 to 10% of $Li_2O$, from 0.5 to 17% of $Na_2O$, from 0 to 16% of $K_2O$, from 0 to 10% of $TiO_2$, from 0 to 5% of $ZrO_2$, from 0 to 25% of $Bi_2O_3$ and from 0 to 10% of $La_2O_3$, in terms of % by mass is preferable.

If the contents of each component are controlled according to the above-mentioned constitution, it is possible to combine refinability, low-temperature encapsulatability and adhesion to a metallic wire without comprising $Sb_2O_3$.

In the present invention, the lead-free glass for semiconductor encapsulation wherein the content of BaO is less than 1% by mass is preferable.

According to the above-mentioned constitution, it is possible to easily increase the content of $CeO_2$ introduced in the glass composition.

Further, the encapsulator for semiconductor encapsulation of the present invention is characterized to be made of the glass above.

Effect of the Invention

Since the lead-free glass for semiconductor encapsulation of the present invention comprises $CeO_2$, the glass is colored and fluoresces. On this account, the encapsulator for semiconductor encapsulation produced by the glass of the present invention makes it possible to automate the appearance inspection by a machine.

Further, in the lead-free glass for semiconductor encapsulation of the present invention, since $CeO_2$ also functions as a refining agent, the amount of $Sb_2O_3$ used may be reduced. Therefore, the glass has excellent refinability, and furthermore, the encapsulator produced using the glass can stably encapsulate semiconductor devices.

EMBODIMENTS FOR CARRYING OUT THE INVENTION

In the lead-free glass for semiconductor encapsulation of the present invention, the temperature at which the viscosity of glass is $10^6$ dPa·s is 670° C. or lower. The temperature at which the viscosity of glass is $10^6$ dPa·s corresponds to approximately an encapsulation temperature of semiconductor devices. Therefore, the glass of the present invention can encapsulate semiconductor devices at 670° C. or lower. Meanwhile, in order to set the temperature at which the viscosity of glass is $10^6$ dPa·s to 670° C. or lower, a $SiO_2$—$B_2O_3$—$R_2O$ (R is an alkali metal) based glass comprising; two or more of $Li_2O$, $Na_2O$ and $K_2O$; and $B_2O_3$ as essential components is preferable.

Further, in the glass of the present invention, the temperature at which the viscosity of glass is $10^6$ dPa·s corresponds to 670° C. or lower, and furthermore, the temperature at which the viscosity of glass is $10^5$ dPa·s corresponds to 800° C. or lower, more preferably 750° C. or lower, and particularly preferably 730° C. or lower, and the temperature at which the viscosity of glass is $10^4$ dPa·s corresponds to 870° C. or lower, more preferably 850° C. or lower, and particularly preferably 800° C. or lower.

Further, in the glass of the present invention, $CeO_2$ is a component to exhibit a refining effect, and to obtain an encapsulator which is colored or fluoresces. On the other hand, $CeO_2$ itself, when excessively introduced, precipitates from the glass to cause devitrification, thereby adversely affecting the dimension of the encapsulator. The content is from 0.01 to 6% by mass, preferably from 0.05 to 4% by mass, and more preferably from 0.1 to 2% by mass. Meanwhile, for the reason that the devitrification resistance is deteriorated, it is difficult to introduce $CeO_2$ in excess into the glass. Accordingly, in the case where it is desired to increase the content of $CeO_2$, it is preferred to reduce the content of BaO, particularly to less than 1% by mass.

When $Sb_2O_3$ is used in the lead-free glass for semiconductor encapsulation of the present invention, there is a concern that Sb metal particulates may be generated inside of the glass as a result of a reduction reaction. In addition, when the glass tends to be reduced, the diffusion speed of the oxide film of the metallic wire is changed, and thus, there is a concern that the semiconductor device cannot be stably encapsulated. For these circumstances, the addition of $Sb_2O_3$ should be avoided as far as possible, and particularly, it is controlled to 0.1% by mass or less. Preferably, it may be controlled to 0.05% by mass or less.

As a specific suitable example of the above-mentioned glass for semiconductor encapsulation, it is preferred to use a glass comprising from 20 to 65% of $SiO_2$, from 0 to 10% of $Al_2O_3$, from 10 to 40% of $B_2O_3$, from 0 to 10% of MgO, from 0 to 10% of CaO, from 0 to 10% of SrO, from 0 to 10% of BaO, from 0 to 35% of ZnO, from 0.2 to 10% of $Li_2O$, from 0.5 to 17% of $Na_2O$, from 0 to 16% of $K_2O$, from 0 to 10% of $TiO_2$, from 0 to 5% of $ZrO_2$, from 0 to 25% of $Bi_2O_3$, from 0 to 10% of $La_2O_3$, from 0.01 to 6% of $CeO_2$ and from 0 to 0.1% of $Sb_2O_3$, in terms of % by mass.

In the glass for semiconductor encapsulation of the present invention, the reason for defining the glass composition range as described above will be explained as follows. Meanwhile, the following expression of "%" indicates "% by mass", unless otherwise specified.

$SiO_2$ is a main component, and is an important component for stabilization of the glass, as well as a component which increases an encapsulation temperature. The content thereof is from 20 to 65%, preferably from 25 to 60%, and more preferably from 30 to 55%. If the content of $SiO_2$ is excessively small, it is difficult to exhibit the above-mentioned effects. In contrast, if the content of $SiO_2$ is excessively large, the low-temperature encapsulation becomes difficult.

$Al_2O_3$ is a component which enhances the chemical resistance, as well as a component which increases the viscosity of the glass. The content of $Al_2O_3$ is from 0 to 10%, preferably from 0.1 to 8%, and more preferably from 0.2 to 7%. If the content of $Al_2O_3$ is excessively large, the viscosity of the glass becomes excessively high, the formability is easily lowered, and the low-temperature encapsulation becomes difficult.

$B_2O_3$ is a component which stabilizes the glass, and simultaneously, is an essential component which lowers the viscosity of the glass. In addition, it is also a component which lowers the chemical resistance. The content thereof is from 10 to 40%, preferably from 12 to 35%, and more preferably from 14 to 30%. If the content of $B_2O_3$ is excessively small, it is difficult to exhibit the above-mentioned effects. In contrast, if the content of $B_2O_3$ is excessively large, the chemical resistance is deteriorated.

Although the alkaline earth metal oxides (R'O), that is, MgO, CaO, SrO and BaO, have an excellent effect of stabilizing the glass, the effect of lowering the temperature of the glass may not be expected, and rather there is a concern that the encapsulation temperature may be raised. Accordingly, the total content of RO is preferably from 0 to 10%, particularly preferably from 0 to 8%, and more particularly preferably from 0 to 6%. Further, each alkaline earth metal oxide component will be explained below.

MgO and CaO are not essential components, and each of the contents is from 0 to 10%, preferably from 0 to 4%, and more preferably from 0 to 2%. If the content of MgO or CaO is excessively large, the viscosity of the glass is increased. Meanwhile, CaO has an effect of enhancing chemical resistance, in addition to the common effect of the above-mentioned alkaline earth metal oxide components.

SrO is not an essential component, and the content thereof is from 0 to 10%, preferably from 0 to 6%, more preferably from 0 to 4%, and particularly preferably from 0 to 2%. If the content of SrO is excessively large, the viscosity of the glass is increased, and thus, it becomes difficult to melt.

BaO is not an essential component, and the content thereof is from 0 to 10%, preferably from 0 to 6%, more preferably from 0 to 4%, and particularly preferably from 0 to 2%. If the content of BaO is excessively large, the viscosity of the glass is increased. Particularly, the content is preferably less than 1% in order to comprise as much as possible of $CeO_2$.

ZnO is a component which has an excellent effect of lowering the viscosity of the glass. ZnO is not an essential component, but, it is preferred to comprise ZnO in an amount of 1% or more in order to obtain the above-mentioned effect. Meanwhile, if ZnO is comprised in excess, the glass is devitrified. The content of ZnO is from 0 to 35%, preferably from 1 to 30%, more preferably from 2 to 25%, particularly preferably from 10 to 25%. Particularly, in the case where ZnO is used for the effect of lowering the viscosity, the ratio (molar ratio) of $ZnO/SiO_2$ may range from 0.02 to 1, and more preferably from 0.05 to 0.8 in order to enhance the effect. The effect may be expected in the ratio of 0.02 or more, but it is preferred that the ratio is 0.05 or more. The ratio is preferably 1 or less, in that the loss of transparency is prevented.

The alkali metal oxides ($R_2O$), that is, $Li_2O$, $Na_2O$ and $K_2O$, have an effect of lowering the viscosity of the glass, or raising a coefficient of expansion. Particularly, $Li_2O$ or $Na_2O$ is used as an essential component in the glass composition because its effect of lowering the viscosity of the glass is excellent. Meanwhile, if the amount of $R_2O$ (the total amount of the alkali metal oxides) is used in excess, a coefficient of expansion is then raised excessively, and thus, a crack is generated in the gap with Dumet. Therefore, the total amount of $R_2O$ is preferably from 8 to 22%, and particularly preferably from 10 to 20%. Incidentally, each alkali metal oxide component will be explained below.

The content of $Li_2O$ is from 0.2 to 10%, preferably from 0.4 to 8%, and more preferably from 0.8 to 6%. If the content of $Li_2O$ is excessively small, it is difficult to exhibit the above-mentioned effects. In contrast, if the content of $Li_2O$ is excessively large, the devitrification resistance is deteriorated.

The content of $Na_2O$ is from 0.5 to 17%, preferably from 1 to 15%, more preferably from 2 to 13%. If the content of $Na_2O$ is excessively small, it is difficult to exhibit the above-mentioned effects. In contrast, if the content of $Na_2O$ is excessively large, the devitrification resistance is deteriorated.

$K_2O$ is not an essential component, but preferably is comprised to some extent to lower temperature and to stabilize against devitrification. The content of $K_2O$ is from 0 to 16%, preferably from 0.2 to 13%, and more preferably from 0.4 to 12%. If the content of $K_2O$ is excessively large, the devitrification resistance is deteriorated.

$TiO_2$ may be added to enhance the chemical resistance. $TiO_2$ is not an essential component, but preferably is added in an amount of 0.2% or more in order to obtain the above-mentioned effects. However, if $TiO_2$ is comprised excessively, the glass is easily devitrified by the contact with metals or refractory materials, resulting in a dimensional problem when forming. The content of $TiO_2$ is from 0 to 10%, preferably from 0.2 to 8%, and more preferably from 0.4 to 6%.

$ZrO_2$ may be added to enhance the chemical resistance. $ZrO_2$ is not an essential component, but preferably is comprised in an amount of 0.05% or more in order to obtain the above-mentioned effects. However, if $ZrO_2$ is comprised excessively, the glass is easily devitrified by the contact with metals or refractory materials, resulting in a dimensional problem when forming. The content of $ZrO_2$ is from 0 to 5%, preferably from 0.05 to 4%, and more preferably from 0.1 to 3%.

$Bi_2O_3$ may be added to enhance the chemical resistance. However, if $Bi_2O_3$ is comprised excessively, the glass is easily devitrified by the contact with metals or refractory materials, resulting in a dimensional problem when forming. The content of $Bi_2O_3$ is from 0 to 25%, preferably from 0 to 20%, and more preferably from 0 to 15%.

$La_2O_3$ may be added to enhance the chemical resistance. However, if $La_2O_3$ is comprised excessively, the glass is easily devitrified by the contact with metals or refractory materials, resulting in a dimensional problem when forming. The content of $La_2O_3$ is from 0 to 10%, preferably from 0 to 8%, and more preferably from 0 to 6%.

Further, other than the above components, various components may be added within a range in which the characteristics of the glass are not damaged. For example, F may be added in an amount of up to 0.5% in order to lower the viscosity of the glass. However, environmentally undesirable components such as $As_2O_3$ are not required to be added. Incidentally, the content of $As_2O_3$, similarly to that of $Sb_2O_3$, is controlled to 0.1% or less.

In order to seal with Dumet, the lead-free glass for semiconductor encapsulation of the present invention preferably has a thermal expansion coefficient of the glass of from $85 \times 10^{-7}$ to $105 \times 10^{-7}/°$ C. at a temperature between 30° C. and 380° C.

Further, when a volume resistance of the glass is lowered, an electrical current slightly flows, for example, between electrodes of a diode to form a circuit as if a resistor is installed in parallel to the diode. Accordingly, the volume resistance is preferably as high as possible. Particularly, the volume resistance value at 150° C. is 7 or higher, preferably 9 or higher, and more preferably 10 or higher in terms of Log p (Ω·cm). Further, in the case where a diode is used suitably at a high temperature of about 200° C., the resistance value at 250° C. is preferably 7 or higher in terms of Log p (Ω·cm).

Subsequently, a method for producing an encapsulator for semiconductor encapsulation which is made of the lead-free glass for semiconductor encapsulation of the present invention will be described below.

A method for producing an encapsulator on an industrial scale comprises a compounding and mixing step of measuring and mixing minerals or purified crystal powder comprising components constituting a glass to compound a raw material to be introduced into a furnace, a melting step of melting and vitrifying the raw material, a forming step of forming the molten glass into a shape of a tube, and a processing step of cutting the tube into a predetermined size.

Firstly, glass raw materials are compounded and mixed. The raw materials consist of minerals made of a plurality of components such as oxides and carbonates and impurities, and may be compounded in consideration of analytical values, and thus, the raw materials are not limited. These are measured by weight, and mixed by a proper mixer depending on the scale, such as a V-shaped mixer, a rocking mixer and a mixer with agitating blades, to obtain a raw material to be introduced.

Subsequently, the raw material is introduced into a glass melting furnace to vitrify. The melting furnace comprises a melting bath for melting and vitrifying the raw materials, a refining bath for raising bubbles in the glass to remove them, and a passage (feeder) for lowering the viscosity of the refined glass and then guiding the glass into a forming apparatus. As the melting furnace, a furnace made of a refractory material, or a furnace lined with platinum on the inside thereof is used, and is heated by heating with a burner or by applying an electric current to the glass. The introduced raw material is normally vitrified in the melting bath at a temperature of from 1,300 to 1,600° C., and then introduced into the refining bath at a temperature of from 1,400 to 1,600° C. Herein, bubbles in the glass are floated and removed. After the glass comes out from the refining bath, the temperature drops while passing through the feeder to the forming apparatus, thereby obtaining a viscosity of from $10^4$ to $10^6$ dPa·s, which is suitable for glass formation.

Subsequently, the glass is formed into a tube shape by the forming apparatus. As a method for forming, Danner process, Vello process, downdraw process or updraw process may be used.

Thereafter, by cutting the glass tube into a predetermined size, an encapsulator for semiconductor encapsulation can be obtained. The cutting process of the glass tube can be performed by cutting the tubes for every one line by a diamond cutter, but as a method suitable for mass production, a method, which includes tying a plurality of glass tubes into one line and then cutting the line by a diamond wheel cutter such that a plurality of glass tubes is cut at once, is normally used.

Subsequently, a method for encapsulating semiconductor devices using an encapsulator which is made of the glass of the present invention, will be described below.

Firstly, electrode materials such as Dumet wire are set using a jig such that a semiconductor device is clamped between the materials at both sides in the encapsulatpr. Thereafter, the entire structure is heated to a temperature of 670° C. or lower to soften and deform the encapsulator, thereby performing air-tight encapsulation. In this manner, a small-sized electronic part, such as a silicon diode, a light-emitting diode and a thermistor, can be produced.

Incidentally, the glass for semiconductor encapsulation of the present invention may be used as a glass tube. In addition, the glass may encapsulate the semiconductor device by making the glass into a powder form and process it to a paste, followed by winding on the semiconductor device and firing.

EXAMPLES

Hereinafter, the present invention will be described with reference to examples.

Table 1 shows Examples (Sample Nos. 1 to 10) of the present invention.

TABLE 1

| (% by mass) | 1 | 2 | 3 | 4 | 5 | 6 | 7 | 8 | 9 | 10 |
|---|---|---|---|---|---|---|---|---|---|---|
| $SiO_2$ | 45.7 | 49.7 | 32.5 | 38.7 | 43.7 | 47.7 | 48.7 | 42.7 | 42.2 | 50.0 |
| $Al_2O_3$ | 3.5 | 0.5 | 1.4 | 0.5 | 6.0 | 2.0 | 1.5 | 0.5 | 1.8 | 4.0 |
| $B_2O_3$ | 20.0 | 14.5 | 24.1 | 24.5 | 20.0 | 20.0 | 20.0 | 25.0 | 18.2 | 21.1 |
| MgO | | | | | | | | | | 1.0 |
| CaO | | 1.0 | 0.9 | 1.0 | | | | 1.0 | 0.9 | 1.0 |
| SrO | | | | | | | | | | 1.0 |
| BaO | | | | | | | | | 1.8 | |
| ZnO | 12.0 | 12.5 | 20.3 | 16.5 | 13.0 | 13.0 | 13.0 | 10.0 | 6.4 | 4.1 |
| $Li_2O$ | 4.0 | 2.5 | 1.6 | 2.5 | 4.5 | 5.0 | 3.5 | 3.5 | 3.7 | 5.2 |
| $Na_2O$ | 8.0 | 5.5 | 9.3 | 5.0 | 10.0 | 10.0 | 11.5 | 3.0 | 7.3 | 6.3 |
| $K_2O$ | 4.0 | 8.5 | 4.5 | 8.0 | 0.5 | | | 11.0 | 3.7 | 6.0 |
| $TiO_2$ | 2.5 | 5.0 | 0.7 | 3.0 | 2.0 | 2.0 | 1.5 | 3.0 | 3.7 | |
| $ZrO_2$ | | | 0.2 | | | | | | | |
| $Bi_2O_3$ | | | | | | | | | 10.0 | |
| $La_2O_3$ | | | 4.3 | | | | | | | |
| $CeO_2$ | 0.3 | 0.3 | 0.2 | 0.3 | 0.3 | 0.3 | 0.3 | 0.3 | 0.3 | 0.3 |
| RO | 0.0 | 1.0 | 0.9 | 1.0 | 0.0 | 0.0 | 0.0 | 1.0 | 2.7 | 3.0 |
| $R_2O$ | 16.0 | 16.5 | 15.4 | 15.5 | 15.0 | 15.0 | 15.0 | 17.5 | 14.7 | 17.5 |
| α (× $10^{-7}$/° C.) [30~380° C.] | 92 | 92 | 90 | 88 | 91 | 91 | 89 | 92 | 95 | 93 |
| Strain point (° C.) | 432 | 447 | 439 | 436 | 434 | 438 | 445 | 431 | 433 | 439 |
| Encapsulation temperature (° C.) | 628 | 659 | 622 | 628 | 621 | 626 | 641 | 639 | 624 | 633 |
| Temperature at which viscosity of glass is $10^5$ dP·s (° C.) | 674 | 710 | 683 | 670 | 666 | 670 | 687 | 688 | 668 | 678 |
| Temperature at which viscosity of glass is $10^4$ dP·s (° C.) | 734 | 777 | 714 | 725 | 724 | 728 | 747 | 750 | 723 | 740 |
| Defoaming property | ○ | ○ | ○ | ○ | ○ | ○ | ○ | ○ | ○ | ○ |
| Encapsulation property | ○ | ○ | ○ | ○ | ○ | ○ | ○ | ○ | ○ | ○ |
| Colorability | ○ | ○ | ○ | ○ | ○ | ○ | ○ | ○ | ○ | ○ |
| Fluorescence | ○ | ○ | ○ | ○ | ○ | ○ | ○ | ○ | ○ | ○ |
| Volume resistance (Ω·cm) [150° C.] | 11.1 | 12.5 | 11.2 | 12.7 | 10.3 | 10.1 | 10.3 | 12.6 | 11.5 | 10.8 |

Glass raw materials were compounded so as to be the glass composition as described in the table, and melt using a platinum pot at 1,200° C. for 3 hours. As for the glass raw materials, silica powder, aluminum oxide, boric acid, magnesium carbonate, calcium carbonate, strontium carbonate, zinc oxide, lithium carbonate, sodium nitrate, potassium carbonate, titanium oxide, zirconium oxide, bismuth oxide, lanthanum oxide, cerium oxide and the like were used. Thereafter, the molten glass was allowed to flow on a metal plate, formed into a plate in a thickness of 4 mm, and then properly annealed. Using each sample thus obtained, the refinability was evaluated. In the evaluation of the refinability, bubbles of 0.1 mm or larger present in the middle portion (measurement area: 3 cm in side) were counted. The bubble number of 3 or less was represented by "○", the bubble number of 4 or 5 was represented by "Δ", and the bubble number of 6 or more was represented by "X".

Further, the thermal expansion coefficient and the encapsulation temperature were evaluated.

The thermal expansion coefficient α is a value which measures an average linear thermal expansion coefficient in a temperature range from 30 to 380° C. by an automatic recording differential dilatometer, using a cylindrical measurement sample having a diameter of about 3 mm and a length of about 50 mm.

The strain point, the encapsulation temperature (temperature at which the viscosity of glass is $10^6$ dPa·s), the temperature at which the viscosity of glass is $10^5$ dPa·s and the the temperature at which the viscosity of glass is $10^4$ dPa·s were determined as follows. First, the strain point and the softening point were measured by the fiber method in accordance with ASTM C338. Subsequently, the temperatures corresponding to viscosities of working point area ($10^4$ dPa·s and $10^{25}$ dPa·s) were determined by the platinum ball pulling-up method. Finally, these viscosities and temperatures were applied to Fulcher equation to calculate the temperatures at which the viscosity of glass is $10^6$ dP·s and $10^5$ dPa·s.

Next, the glass raw material was melt as described above. Subsequently, the molten glass was wound with a glass blowing rod to draw a glass tube having an outer diameter of 1.4 mm and an inner diameter of 0.8 mm, and then cut the tube to 1.8 mm. Then, Dumet wire was inserted into the glass tube, and heated for 10 minutes at the encapsulation temperature as calculated above to obtain Dumet encapsulator samples. Using these samples, the encapsulatability, the colorability and the fluorescence were evaluated. Meanwhile, the encapsulatability was evaluated by observing the appearance of the Dumet wire. The case that the color of the Dumet wire was dark red was represented by "○", the case of brown color was represented by "Δ", and the case of exhibiting metallic luster was represented by "X".

The colorability was evaluated by visually observing the appearance of the glass tube.

The fluorescence was evaluated by irradiating UV-rays to the glass tube using a light source with a wavelength of 365 nm. In the evaluation, the case that strong fluorescence was generated from the glass tube was represented by "○", the case that weak fluorescence was generated, or the case that no fluorescence was generated, was represented by "X". Meanwhile, the evaluation may be performed using a light source with a wavelength of 254 nm, but the UV-rays with a wavelength of 254 nm are dangerous to eyes. Therefore, in the present examples, a light source with a wavelength of 365 nm was used.

The volume resistivity at 150° C. is a value measured by the method in accordance with ASTM C-657.

INDUSTRIAL APPLICABILITY

The glass according to the present invention is suitable for a material for glass encapsulator used in encapsulating semiconductor devices such as thermistors, diodes and LEDs.

Although the present invention has been described in detail and by reference to the specific embodiments, it is apparent to one skilled in the art that various modifications or changes can be made without departing from the spirit and scope of the present invention.

Incidentally, the present application is based on a Japanese Patent Application filed on Jul. 1, 2010 (Japanese Patent Application No. 2010-150971), the entire content of which is incorporated herein by reference. Further, all references cited herein are incorporated in its entirety.

The invention claimed is:

1. A lead-free glass for semiconductor encapsulation, wherein a temperature at which the viscosity of glass is $10^6$ dPa·s is 670° C. or lower, and, as a glass composition, the content of $CeO_2$ is from 0.01 to 4% by mass, the content of $Sb_2O_3$ is 0.1% by mass or less, the content of $SiO_2$ is from 20 to 65% by mass, the content of $Bi_2O_3$ is 0 to 20% by mass, the content of $B_2O_3$ is from 14 to 40% by mass, and the glass further comprises a total content of $R_2O$ from 14.7 to 22% by mass, wherein $R_2O$ is $Li_2O$, $Na_2O$, and $K_2O$.

2. The lead-free glass for semiconductor encapsulation according to claim 1, which comprises, as a glass composition, from 20 to 65% of $SiO_2$, from 0 to 10% of $Al_2O_3$, from 0 to 10% of MgO, from 0 to 10% of CaO, from 0 to 10% of SrO, from 0 to 10% of BaO, from 0 to 35% of ZnO, from 0 to 10% of $TiO_2$, from 0 to 5% of $ZrO_2$, from 0 to 20% of $Bi_2O_3$ and from 0 to 10% of $La_2O_3$, in terms of % by mass.

3. The lead-free glass for semiconductor encapsulation according to claim 1, wherein the content of BaO is less than 1% by mass.

4. An encapsulator for semiconductor encapsulation made of the glass according to claim 1.

* * * * *